United States Patent [19]

Kurachi

[11] Patent Number: 5,739,571
[45] Date of Patent: Apr. 14, 1998

[54] SEMICONDUCTOR DEVICE HAVING PROTECTION DEVICE FOR PREVENTING THE ELECTROSTATIC BREAKDOWN OF OUTPUT BUFFER MOSFETS

[75] Inventor: Ikuo Kurachi, Tokyo, Japan

[73] Assignee: Oki Electric Industry Co., Ltd., Tokyo, Japan

[21] Appl. No.: 518,832

[22] Filed: Aug. 24, 1995

[30] Foreign Application Priority Data

Aug. 31, 1994 [JP] Japan .................................. 6-206967

[51] Int. Cl.⁶ .................................................. H01L 23/62
[52] U.S. Cl. ...................... 257/360; 257/355; 257/356; 257/357
[58] Field of Search ........................ 257/355, 356, 257/357, 360

[56] References Cited

U.S. PATENT DOCUMENTS

| 5,060,037 | 10/1991 | Rountree | 257/357 |
| 5,290,724 | 3/1994 | Leach | 257/356 |
| 5,495,118 | 2/1996 | Kinoshita et al. | 257/355 |

OTHER PUBLICATIONS

"Improvement of 'Soft Breakdown' Leakage of off-State nMOSFETs Induced by HBM ESD Events Using Drain Engineering for LDD Structure", by Ikuo Kurachi and Yasuhiro Fukuda, in IEICE Transactions, vol. E77-A, No. 1, Jan. 1994, pp. 166-173.

Primary Examiner—Steven H. Loke

[57] ABSTRACT

A semiconductor device of the present invention includes an integrated circuit formed on a first conduction-type semiconductor substrate, an output buffer circuit for outputting a signal obtained from the integrated circuit, a protection circuit for protecting the output buffer circuit and a voltage supply circuit for supplying a voltage to the semiconductor substrate. The output buffer circuit has buffer MOSFETs. The protection circuit has protection elements for preventing electrostatic breakdown of the buffer MOSFETs. Impurity diffusion layers of the buffer MOSFETs are separated from impurity diffusion layers of the protection elements and a field oxide film is disposed therebetween at predetermined intervals. Owing to such a construction, the electrostatic breakdown of each buffer MOSFET can be prevented from occurring.

6 Claims, 11 Drawing Sheets 5,739,571

SEMICONDUCTOR DEVICE HAVING PROTECTION DEVICE FOR PREVENTING THE ELECTROSTATIC BREAKDOWN OF OUTPUT BUFFER MOSFETS

BACKGROUND OF THE INVENTION

1. Field of the Invention

The present invention relates to semiconductor devices, and particularly to a semiconductor device having protection elements for preventing output buffer MOSFETs from electrostatic breakdown.

2. Description of the Related Art

A semiconductor device having a MOS integrated circuit, an output buffer circuit and a voltage supply circuit has heretofore been known. The voltage supply circuit is a circuit which supplies a voltage to a semiconductor substrate to activate the MOS integrated circuit at high speed and in a stable state.

With regard to the above-mentioned semiconductor device, there is known one device which is disclosed in, for example, "IEICE TRANSACTION" VOL. E77-A p. 166–172, 1994.

The disclosed semiconductor device has offset gate MOSFETs (MOSFETs for prevention of electrostatic breakdown) for preventing buffer MOSFETs from electrostatic breakdown. The electrostatic-breakdown preventive MOSFETs and the buffer MOSFETs are electrically connected in parallel between an output terminal of a MOS integrated circuit and a ground terminal.

Even in the case of this type of semiconductor device, however, the buffer MOSFETs cannot be fully prevented from electrostatic breakdown.

SUMMARY OF THE INVENTION

With the foregoing in mind, it is therefore an object of the present invention to provide a semiconductor device capable of more effectively preventing buffer MOSFETs from electrostatic breakdown.

According to one aspect of the present invention, for achieving the above object, there is provided a semiconductor device comprising:

- an integrated circuit formed on a first conduction-type semiconductor substrate;
- an output buffer circuit for outputting a signal obtained from the integrated circuit;
- a protection circuit for protecting the output buffer circuit; and
- a voltage supply circuit for supplying a voltage to the semiconductor substrate;
- the output buffer circuit having buffer MOSFETs;
- the protection circuit having protection elements for preventing electrostatic breakdown of the buffer MOSFETs;
- the buffer MOSFETs having impurity diffusion layers separated from one another by impurity diffusion layers of the protection elements and a field oxide film and disposed at predetermined intervals.

BRIEF DESCRIPTION OF THE DRAWINGS

While the specification concludes with claims particularly pointing out and distinctly claiming the subject matter which is regarded as the invention, it is believed that the invention, the objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described in detail with reference to the accompanying drawings.

Figure 1:
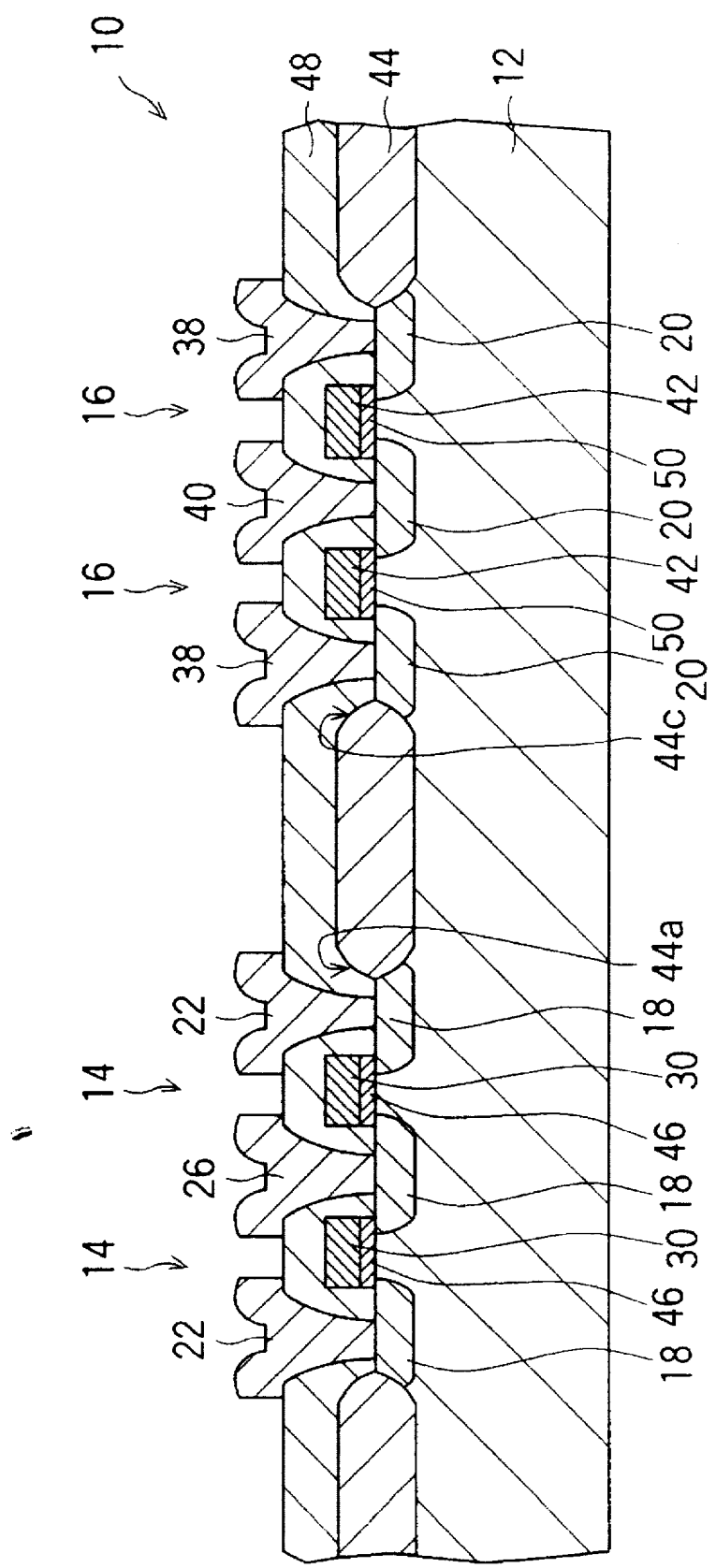
FIG. 1 is a cross-sectional view showing a fragmentary configuration of a semiconductor device according to a first embodiment of the present invention.
Figure 2:
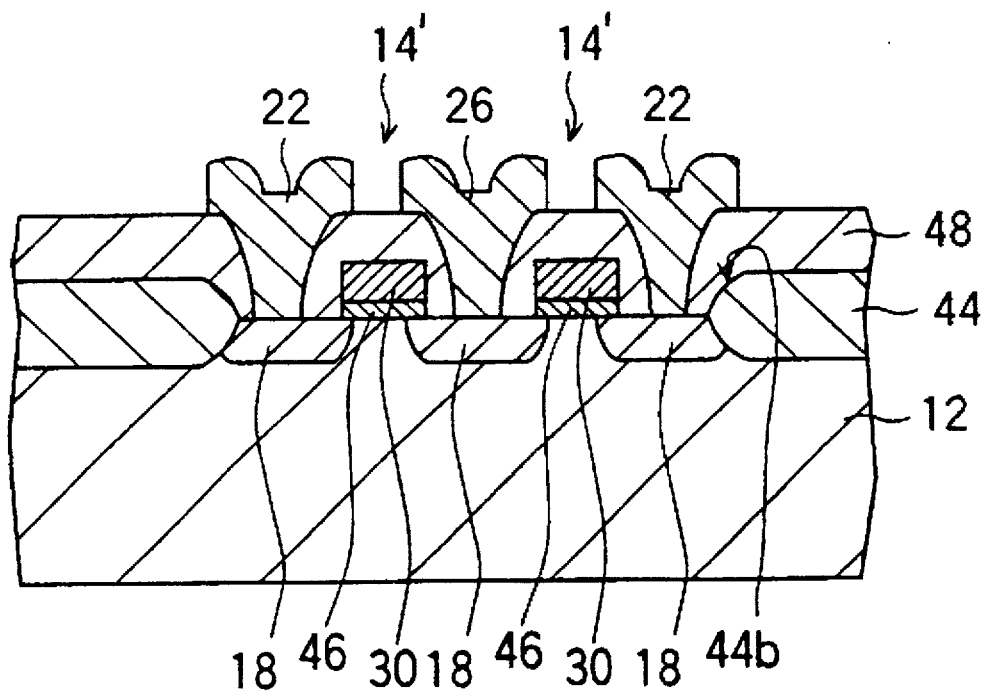
FIG. 2 is a cross-sectional view illustrating another fragmentary configuration of the semiconductor device according to the first embodiment shown in FIG. 1.
Figure 3:
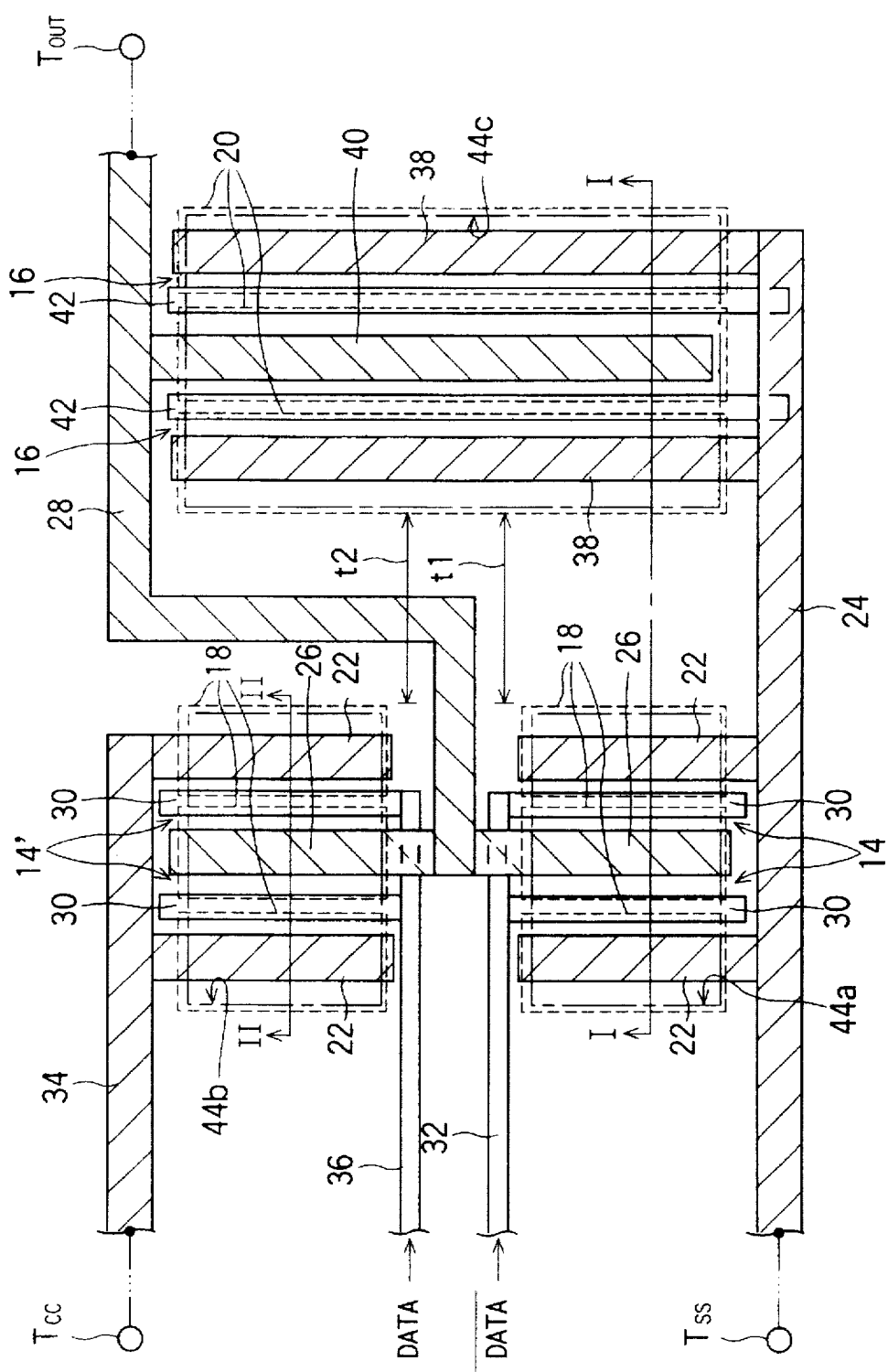
FIG. 3 is a plan view depicting the overall fragmentary configuration of the semiconductor device according to the first embodiment shown in FIG. 1.

FIGS. 1 and 2 are cross-sectional views showing fragmentary configurations of a semiconductor device according to a first embodiment of the present invention. FIG. 3 is a plan view showing the overall fragmentary configuration of the semiconductor device according to the first embodiment. Reference numerals 14 indicate buffer MOSFETs and reference numerals 16 indicate protection elements. Other elements of structure will not be shown within an understandable range of the first embodiment. FIG. 3 shows a structure of the semiconductor device in which attention has been principally paid to a wiring structure. A cross-section taken along line I—I of FIG. 3 corresponds to FIG. 1, whereas a cross-section taken along line II—II of FIG. 3 corresponds to FIG. 2.

The semiconductor device according to the first embodiment has an integrated circuit, an output buffer circuit, a protection circuit and a voltage supply circuit all of which are provided on a first conduction-type semiconductor substrate.

The output buffer circuit is a circuit for outputting a signal obtained from the integrated circuit and has the buffer MOSFETs 14. The protection circuit is a circuit for protecting the output buffer circuit and has a pair of protection elements 16 for preventing electrostatic breakdown of the buffer MOSFETs 14. The voltage supply circuit is a circuit for supplying a voltage to the semiconductor substrate as known in the art.

The output buffer circuit will be firstly described below.

As shown in FIGS. 1 and 3, the output buffer circuit has two buffer MOSFETs 14 (hereinafter called "buffer MOSs 14") electrically parallel-connected between an output terminal $T_{OUT}$ and a ground terminal $T_{SS}$. Each of the buffer MOSs 14 includes a first main electrode 22 and a second main electrode 26. Either one of the first and second main electrodes 22 and 26 may be used as a source electrode or a drain electrode. In the present embodiment, however, the first main electrode 22 and the second main electrode 26 will be used as the source and drain electrodes respectively.

The first main electrode 22 of each buffer MOS 14 is electrically connected to the ground terminal $T_{SS}$ via a ground line 24. The second main electrode 26 for the buffer MOSs 14 is electrically connected to the output terminal $T_{OUT}$ via an output line 28. Each of gate electrodes 30 of the buffer MOSs 14 is supplied with an output signal DATA (negative of output signal DATA) through an inverter gate (not shown) and a data line 32.

Further, the output buffer circuit has two buffer MOSFETs 14' (hereinafter called "buffer MOSs 14') electrically parallel-connected between the output terminal $T_{OUT}$ and a power source terminal $T_{CC}$ as shown in FIG. 3. Each of the buffer MOSs 14' has a first main electrode 22 and a second main electrode 26. Either one of the first main electrode 22 and the second main electrode 26 may be used as a source electrode or a drain electrode. In the present embodiment, however, the first main electrode 22 and the second main electrode 26 will be used as the source and drain electrodes respectively.

The first main electrode 22 of each buffer MOS 14' is electrically connected to the power source terminal $T_{CC}$ through a power source line 34. The second main electrode 26 is electrically connected to the output terminal $T_{OUT}$ through the output line 28. Each of gate electrodes 30 of the buffer MOSs 14' is supplied with the output signal DATA through a data line 36.

The protection circuit will next be described.

As shown in FIGS. 1 and 3, the protection circuit has two protection elements 16 electrically connected in parallel between the output terminal $T_{OUT}$ and the ground terminal $T_{SS}$. Each of the protection elements 16 is of a MOSFET having an offset gate structure. Each protection element 16 includes a first main electrode 38 and a second main electrode 40. Either one of the first and second main electrodes 38 and 40 may be used as a source electrode or a drain electrode. In the present embodiment, however, the first main electrode 38 and the second main electrode 40 will be used as the source electrode and the drain electrode respectively.

The first main electrode 38 of the protection element 16 is electrically connected to the ground terminal $T_{SS}$ through the ground line 24. The second main electrode 40 is electrically connected to the output terminal $T_{OUT}$ through the output line 28. A terminal supplied with a voltage greater than or equal to a ground voltage $V_{SS}$ and less than or equal to a power source voltage $V_{CC}$ is electrically connected to a gate electrode 42 of each protection circuit 16. In the present embodiment, the gate electrode 42 is electrically connected to the ground terminal $T_{SS}$ through the ground line 24. Namely, the gate electrode 42 and the first main electrode 38 are short-circuited via the ground line 24.

The voltage supply circuit supplies a base power source voltage $V_{bb}$ or a substrate bias $V_{bb}$ for activating a logical arithmetic circuit of the integrated circuit at high speed and in a stable state to a semiconductor substrate 12.

Hatching to be described below is shown in FIG. 3 to enable easy understanding of the drawing.

Each of the ground line 24 and the first main electrodes 22 electrically connected to the ground line 24 is indicated by hatching extending diagonally to the upper left. Each of the power source line 34 and the first main electrodes 22 electrically connected to the power source line 34 is also indicated by the same hatching as described above. Further, each of the output line 28 and the second main electrodes 26 and 40 electrically connected to the output line 28 is indicated by hatching extending diagonally to the upper right. Impurity diffusion layers 18 and 20 are respectively indicated by dotted lines and windows 44a, 44b and 44c of a field oxide film 44 shown in FIG. 2 are respectively indicated by dashed lines.

A description will now be made of the structure of each protection element while paying attention to its structure. The first conduction-type semiconductor substrate 12 is of a p-type Si substrate. The field oxide film 44 is provided on the semiconductor substrate 12. The field oxide film 44 has the windows 44a, 44b and 44c in which the field oxide film 44 is not formed therein and the semiconductor substrate 12 is in an exposed state. The windows 44a and 44b are regions for providing the buffer MOSs 14 and 14' respectively. Further, the window 44c is a region for providing the protection elements 16.

Each buffer MOS 14 has a gate insulating film 46 and a gate electrode 30 successively formed on the semiconductor substrate 12 and an n-type impurity diffusion layer 18. The buffer MOS 14 is not shown in the drawing in detail but has an LDD (Lightly Doped Drain) structure. Namely, an end of each n-type impurity diffusion layer 18 on the gate electrode side and a region near the end are composed of n⁻ low impurity density layers, whereas a region other than these is composed of an n⁺ high impurity density layer. Since each MOS having such an LDD structure has an advantage that it is able to prevent the generation of hot carriers, this structure is suitable for use in the buffer MOS.

Each of the protection elements 16 has a gate insulating film 50 and a gate electrode 42 successively formed on the semiconductor substrate 12 and an n-type impurity diffusion layer 20. In the present embodiment, the protection element 16 is of the MOSFET having the offset gate structure. Thus, although not shown in the drawing in detail, the gate electrodes 42 each disposed between the first main electrode 38 and the second main electrode 40 are provided so as to be closer to the second main electrode 40 than to the first main electrode 38.

Thus, each gate electrode 42 is not superposed on a diffusion layer (source diffusion layer) on the first main electrode 38 side as seen on the plane. Since a drain withstand voltage $BV_{sd}$ of each MOSFET having such an offset gate structure is lower than a drain withstand voltage $BV_{sd}$ of the protected LDD-type buffer MOS 14, the MOSFET having such an offset gate structure is suitable for use in the protection element.

A plurality of buffer MOSs 14 (two buffer MOSs 14 in the present embodiment) are provided on the semiconductor substrate 12 which falls within the region corresponding to the window 44a. The gate electrodes 30 of the two buffer MOSs 14 are disposed in parallel. The impurity diffusion layers 18 are respectively provided on the sides of the gate electrodes 30. In the present embodiment, a common impurity diffusion layer 18 is provided between the two gate electrodes 46. Thus, the first main electrodes 22 are respectively electrically connected to the odd-numbered impurity diffusion layers 18 and the second main electrodes 26 are respectively electrically connected to the even-numbered impurity diffusion layers 18.

The data line 32 (FIG. 3) electrically connected to the gate electrodes 30 of the buffer MOSs 14 is provided on the field oxide film 44. Further, an interlayer insulating film 48 is provided on the gate electrodes 30 and the data line 32. The first main electrodes 22, the second main electrodes 26, the ground line 24 and the output line 28 are provided on the interlayer insulating film 48. As described above, the ground line 24 is electrically connected to the first main electrodes 22. The output line 28 is electrically connected to the second main electrodes 26. Further, the first and second main electrodes 22 and 26 are electrically connected to their corresponding impurity diffusion layers 18 through contact holes defined in the interlayer insulating film 48.

A plurality of buffer MOSs 14' (two buffer MOSs 14' in the present embodiment) are provided on the semiconductor substrate 12 which falls within a region corresponding to the window 44b. The gate electrodes 30 of the two buffer MOSs 14' are disposed in parallel. The impurity diffusion layers 18 are respectively provided on the sides of the gate electrodes 30. In the present embodiment, a common impurity diffusion layer 18 is provided between the two gate electrodes 30. Thus, the first main electrodes 22 are respectively electrically connected to the odd-numbered impurity diffusion layers 18 and the second main electrodes 26 are respectively electrically connected to the even-numbered impurity diffusion layers 18.

The data line 36 (FIG. 3) electrically connected to the gate electrodes 30 of the buffer MOSs 14' is provided on the field oxide film 44. Further, an interlayer insulating film 48 is provided on the gate electrodes 30 and the data line 32. The first main electrodes 22, the second main electrodes 26, the power source line 34 and the output line 28 are provided on the interlayer insulating film 48. As described above, the power source line 34 is electrically connected to the first main electrodes 22. The output line 28 is electrically connected to the second main electrodes 26. Further, the first and second main electrodes 22 and 26 are electrically connected to their corresponding impurity diffusion layers 18 through contact holes defined in the interlayer insulating film 48.

A plurality of protection elements 16 (two protection elements 16 in the present embodiment) are provided on the semiconductor substrate 12 which falls within a region corresponding to the window 44c. The gate electrodes 42 of the two protection elements 16 are disposed in parallel. The impurity diffusion layers 20 are provided on the sides of the gate electrodes 42. In the present embodiment, a common impurity diffusion layer 20 is disposed between the two gate electrodes 42. Thus, the first main electrodes 38 are respectively electrically connected to the odd-numbered impurity diffusion layers 20, whereas the second main electrodes 40 are respectively electrically connected to the even-numbered impurity diffusion layers 20.

Further, the interlayer insulating film 48 is provided on the gate electrodes 42 of the protection elements 16. The first and second main electrodes 38 and 40 are provided on the interlayer insulating film 48. The gate electrodes 42 are electrically connected to the ground line 24 on the interlayer insulating film 48 via contact holes defined in the interlayer insulating film 48. The first and second main electrodes 38 and 40 are electrically connected to their corresponding impurity diffusion layers 20 through the contact holes defined in the interlayer insulating film 48.

In the semiconductor device 10 according to the present embodiment, as has been described above in detail, the impurity diffusion layers 18 of each buffer MOS 14 and the impurity diffusion layers 20 of each protection element 16 are respectively separated from one another and disposed so as to be spaced away from one another. This is because the substrate 12 and the field oxide film 44 are interposed between the impurity diffusion layers 18 and 20.

Similarly, the impurity diffusion layers 18 of each buffer MOS 14' and the impurity diffusion layers 20 of each protection element 16 are respectively separated from one another and disposed so as to be spaced away from one another. This is because the substrate 12 and the field oxide film 44 are also interposed between the impurity diffusion layers 18 and 20.

In the semiconductor device 10 according to the present embodiment as well, the buffer MOSs 14 and the protection elements 16 are electrically connected in parallel between the output terminal $T_{OUT}$ and the ground terminal $T_{SS}$.

The drain withstand voltage $BV_{sd}$ of each protection element 16 is set so as to become lower than the drain withstand voltage $BV_{sd}$ of each buffer MOS 14. Thus, an electrostatic discharge input to the output terminal $T_{OUT}$ is supplied to channels and the semiconductor substrate 12 provided near the channels through the output line 28, the second main electrode 40 and the impurity diffusion layers 20 serving as the drains. This triggers the turning on of each protection element 16. Therefore, the electrostatic discharge becomes a collector current for the protection element 16 so as to flow into the ground terminal $T_{SS}$. As a result, each of the buffer MOS 14 and the buffer MOS 14' can be prevented from electrostatically breaking down.

When the electrostatic discharge flows into the channels and the semiconductor substrate 12 near the channels, a potential at the semiconductor substrate 12 is raised. Since, however, each of the impurity diffusion layers 18 of the buffer MOSs 14 and 14' and each of the impurity diffusion layers 20 of the protection elements 16 are separated from one another by the semiconductor substrate 12 and the field oxide film 44 as mentioned above, the resistance between the impurity diffusion layers 18 and 20 increases. Thus, since a voltage drop is developed by the resistance, the potential at each of the channels of the buffer MOSs 14 and 14' and the potential at the semiconductor substrate 12 provided near the channels can be prevented from increasing or being reduced. As a result, the drain withstand voltages $BV_{sd}$ of the buffer MOSs 14 and 14' are little reduced, thereby making it possible to prevent snapback of each of the buffer MOSs 14 and 14'.

Now consider that an interval between the impurity diffusion layer 18 of the buffer MOS 14 and the impurity diffusion layer 20 of the protection element 16 and an interval between the impurity diffusion layer 18 of the buffer MOS 14' and the impurity diffusion layer 20 thereof are respectively t1 and t2 as shown in FIG. 3. Each of the intervals t1 and t2 may preferably be set to at least 5 μm to increase the resistance between the impurity diffusion layers 18 and 20 and effectively control the snapback of each of the buffer MOSs 14 and 14'. Each of the intervals t1 and t2 may preferably be set as short as possible even from the viewpoint of an increase in integration of the semiconductor device.

It is also desirable to shorten gate lengths of the buffer MOSs 14 and 14' from the viewpoint of minimization of the element and an improvement in its operating ability. Thus, when the gate lengths are made short, it is preferable to form the buffer MOSs 14 and 14' as the MOSs each having the LDD structure and prevent the performance of each buffer MOS from being deteriorated due to the generation of the hot carriers. In this case, however, each buffer MOS is apt to break due to the electrostatic discharge. Since this breakdown takes place due to the snapback of each buffer MOS, it is necessary to prevent the snapback from occurring, as will be described below.

The snapback is developed when a source-to-drain voltage of each buffer MOS reaches the drain withstand voltage $BV_{sd}$ thereof. Accordingly, the drain withstand voltage $BV_{sd}$ of each protection element 16 may be set lower than the drain withstand voltage $BV_{sd}$ of each buffer MOS. Further, the protection element 16 may be formed as a structure such as the offset gate structure, which is hard to break down against the snapback.

Further, the protection elements 16 are in an off state when the semiconductor device is in normal operation. Thus, even if such protection elements are incorporated into the semiconductor device, the semiconductor device, particularly, the output buffer circuit including the buffer MOSs can be activated without any problem.

An electrostatic breakdown property of the semiconductor device 10 against the electrostatic discharge supplied from the output terminal $T_{OUT}$ of the semiconductor device 10 is determined by the protection elements 16.

Figure 4:
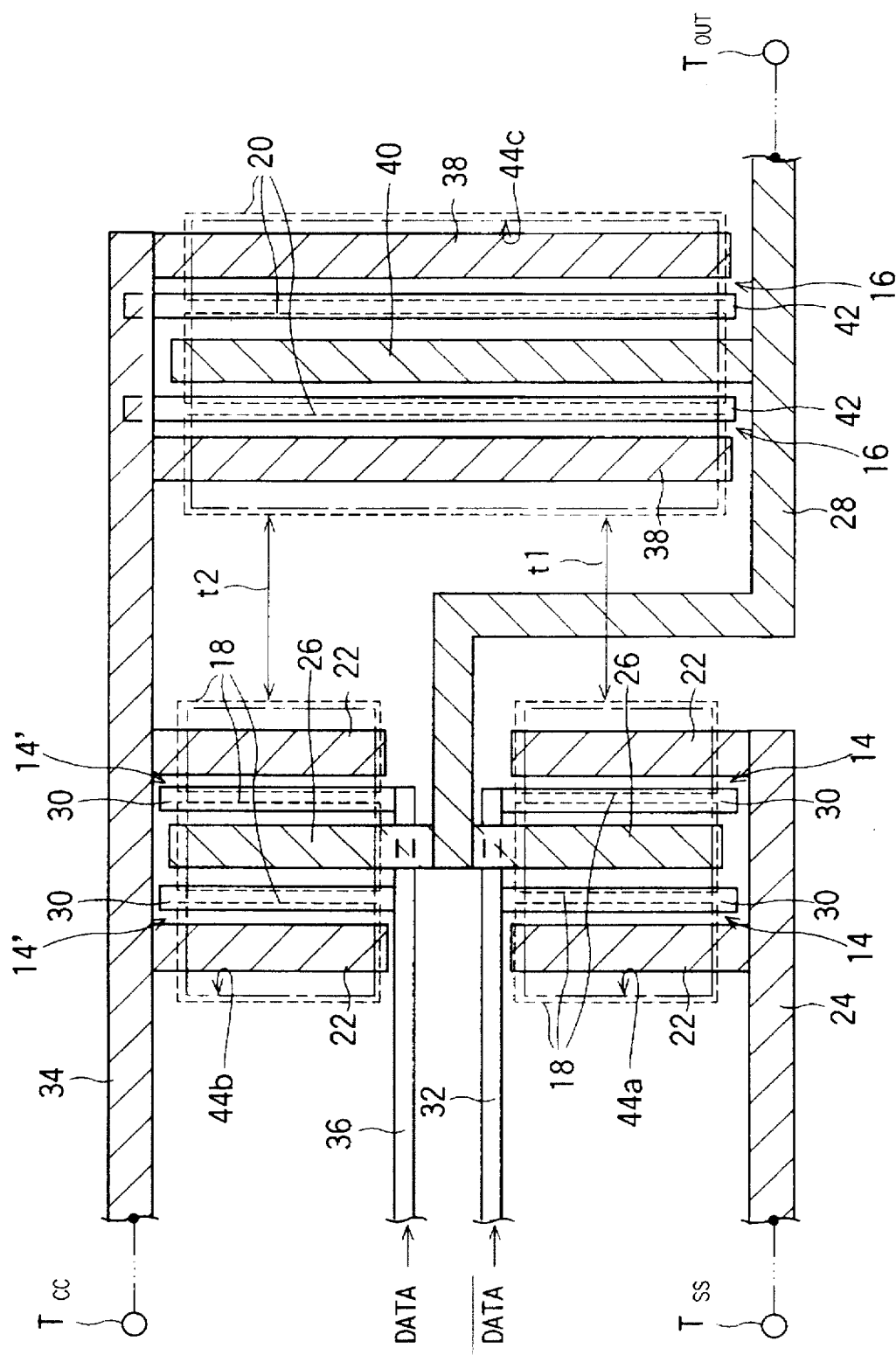
FIG. 4 is a plan view illustrating a fragmentary configuration of a semiconductor device according to a second embodiment of the present invention.

FIG. 4 is a plan view schematically showing a fragmentary configuration of a semiconductor device according to a second embodiment of the present invention. In a manner similar to FIG. 3, configurations of buffer MOSs 14 and 14' and protection elements 16 and configurations around these are shown in FIG. 4. The dissimilarities between the first embodiment and the second embodiment will be principally described below. A detailed description of the similarities between the two will be omitted.

In the second embodiment, the buffer MOSs 14 and the protection elements 16 are electrically connected in parallel between an output terminal $T_{OUT}$ and a drive power terminal $T_{CC}$ as shown in FIG. 4.

In the present embodiment, first main electrodes 22 of the buffer MOSs 14' and first main electrodes 38 of the protection elements 16 are electrically connected to the drive power terminal $T_{CC}$ through a power source line 34. Further, a second main electrode 26 of each buffer MOS 14' and a second main electrode 40 of each protection element 16 are electrically connected to the output terminal $T_{OUT}$ through an output line 28. Namely, the buffer MOSs 14' and the protection elements 16 are electrically connected in parallel between the output terminal $T_{OUT}$ and the drive power terminal $T_{CC}$. Next, a gate electrode 42 of each protection element 16 is electrically connected to a terminal supplied with a voltage more than or equal to a ground potential $V_{SS}$ and less than or equal to a power source voltage $V_{CC}$. In the present embodiment, the gate electrode 42 of each protection element 16 is electrically connected to drive power terminal $T_{CC}$ through the power source line 34. Namely, the gate electrodes 42 and the first main electrodes 38 of the protection elements 16 are short-circuited via the power source line 34.

According to the semiconductor device of the second embodiment, an electrostatic discharge inputted to the output terminal $T_{OUT}$ becomes a collector current for each protection element 16 so as to flow into the drive power terminal $T_{CC}$. It is thus possible to prevent electrostatic breakdown of each buffer MOS.

In the present embodiment, the buffer MOSs 14' and the protection elements 16 are electrically connected in parallel between the output terminal $T_{OUT}$ and the drive power terminal $T_{CC}$. In addition to the above, however, the buffer MOSs 14 and the protection elements may be electrically connected in parallel between the output terminal $T_{OUT}$ and the ground terminal $T_{SS}$ in a manner similar to the first embodiment.

Figure 5:
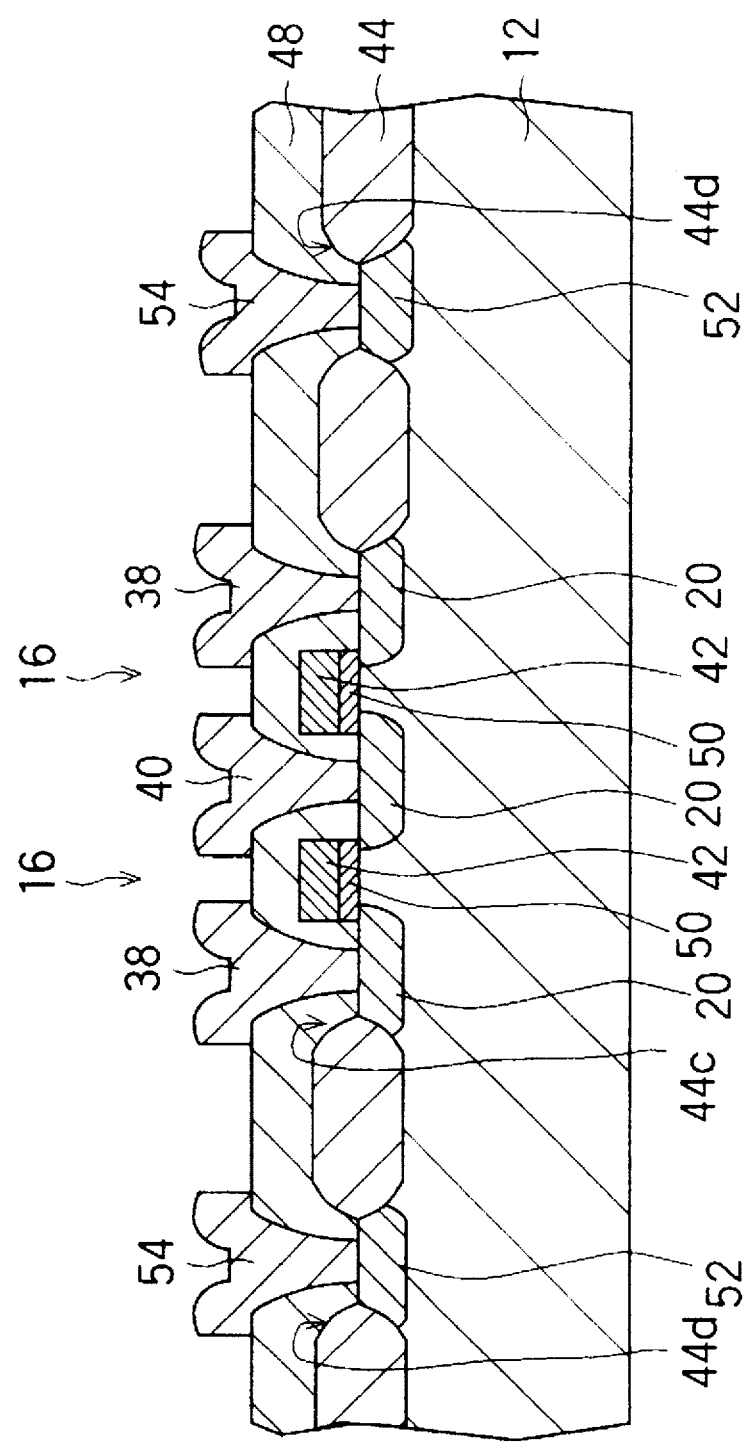
FIG. 5 as a cross-sectional view showing a fragmentary configuration of a semiconductor device according to a third embodiment of the present invention.
Figure 6:
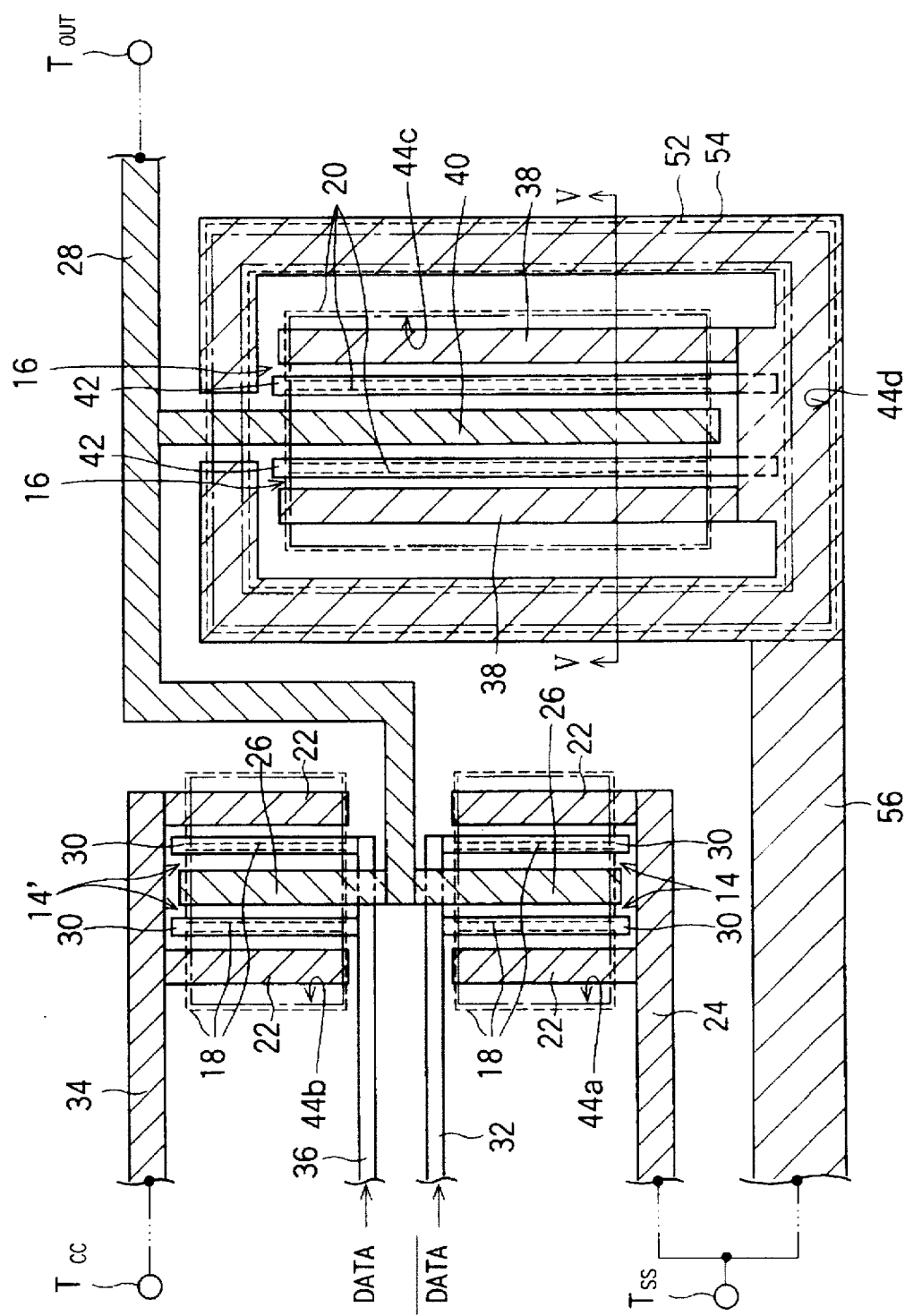
FIG. 6 is a plan view illustrating the fragmentary configuration of the semiconductor device shown in FIG. 5.

FIGS. 5 and 6 are respective cross-sectional and plan views showing a fragmentary configuration of a semiconductor device according to a third embodiment of the present invention. Configurations of buffer MOSs 14 and 14' and protection elements 16 and configurations around these are shown in FIG. 6 in a manner similar to FIG. 3. A cross-section taken along line V—V of FIG. 6 corresponds to the cross-sectional view of FIG. 5. The dissimilarities between the third embodiment and the first embodiment will be principally described below. The similarities therebetween will not be described in detail.

In the third embodiment, the semiconductor device 10 has a second conduction-type guardring 52 electrically connected to a ground line terminal $T_{SS}$ as shown in FIGS. 5 and 6. Impurity diffusion layers 20 for the protection elements 16 are formed inside the guardring 52.

The guardring 52 is composed of an n-type high-density impurity diffusion layer ($n^+$ layer). The guardring 52 is formed around a window 44d defined in a field oxide film 44. Further, a guardring electrode 54 and a ground line 56 are provided on an interlayer insulating film 48. The guardring electrode 54 is electrically connected to the ground line terminal $T_{SS}$ through a ground line 56. Further, the guardring electrode 54 is electrically connected to the guardring 52 through contact holes defined in the interlayer insulating film 48. Owing to such a construction, the guardring 52 is electrically connected to a ground potential.

Further, first main electrodes 38 of the protection elements 16 are electrically connected to the guardring electrode 54. Thus, the first main electrodes 38 of the protection elements 16 are electrically connected to the ground line terminal $T_{SS}$ through the guardring electrode 54 and the ground line 56. Further, a second main electrode 40 for the protection elements 16 is electrically connected to an output terminal $T_{OUT}$ through an output line 28.

Further, first main electrodes 22 of the buffer MOSs 14 are electrically connected to the ground line terminal $T_{SS}$ through a ground line 24 different from the ground line 56. A second main electrode 26 for the buffer MOSs 14 is electrically connected to the output terminal $T_{OUT}$ through the output line 28. Namely, the protection elements 16 and the buffer MOSs 14 are electrically connected in parallel between the output terminal $T_{OUT}$ and the ground line terminal $T_{SS}$.

Further, gate electrodes 42 of the protection elements 16 are electrically connected to the guardring electrode 54. Accordingly, the gate electrodes 42 are electrically connected to the ground line terminal $T_{SS}$ through the guardring electrode 54 and the ground line 56. In addition, the gate electrodes 42 are short-circuited to the first main electrodes 38 through the guardring electrode 54.

In FIG. 6, the guardring electrode 54 and the ground line 56 are indicated by hatching extending diagonally to the upper left to provide easy understanding of the drawing.

Figure 7:
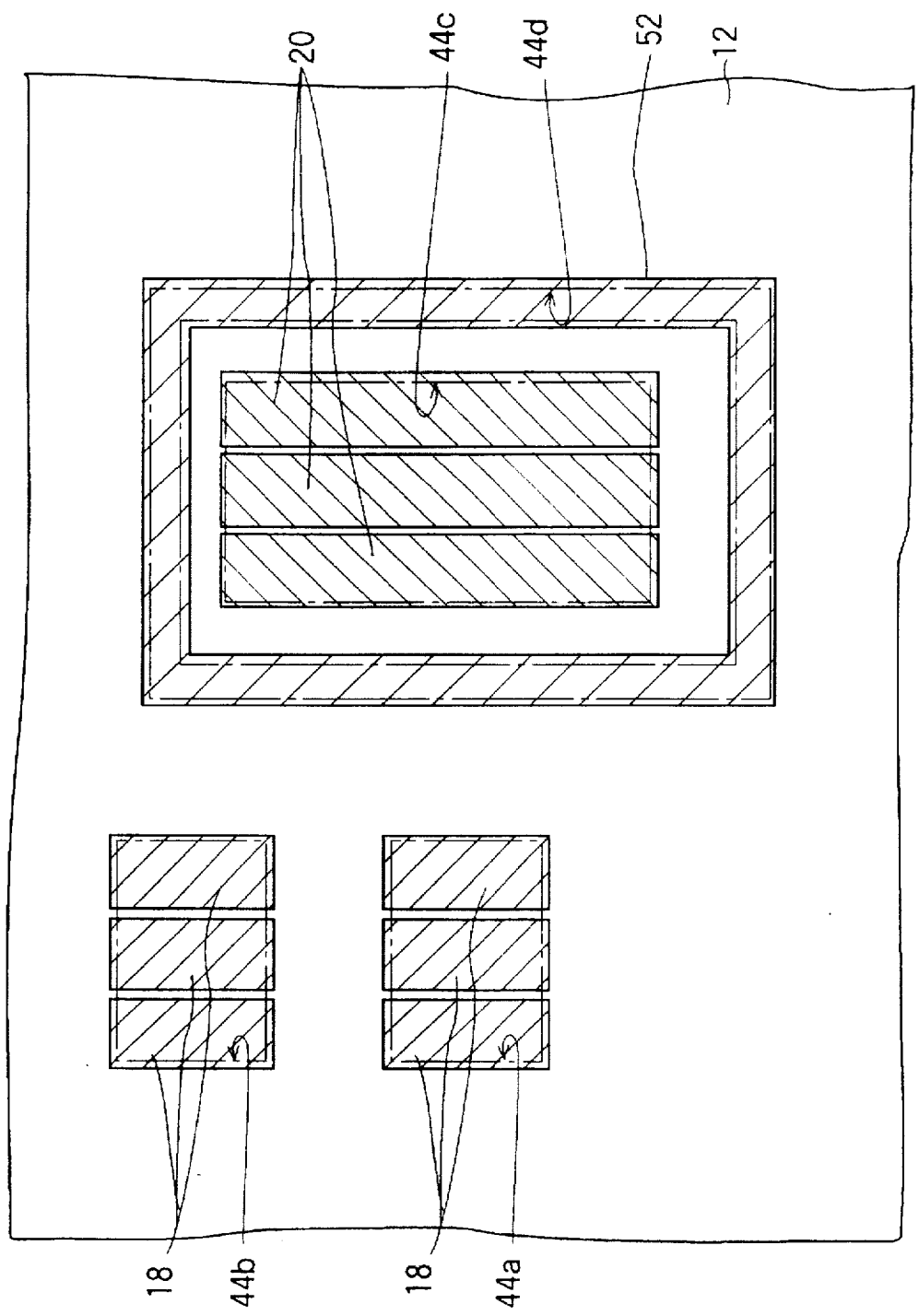
FIG. 7 is a plan view showing configurations of both a guard ring and impurity diffusion layers employed in the semiconductor device shown in FIG. 5.

FIG. 7 is a plan view showing configurations of the guardring and impurity diffusion layers employed in the semiconductor device according to the third embodiment. A semiconductor substrate 12, the impurity diffusion layers 18 and 20 and the guardring 52 are shown in FIG. 7. Each of the impurity diffusion layers 18 is indicated by hatching which is reduced in pitch and extends diagonally to the upper left. Each of the impurity diffusion layers 20 is indicated by hatching extending diagonally to the upper right. Further, the guardring 52 is indicated by hatching which is large in pitch and extends diagonally to the upper left. Windows 44a through 44c of a field oxide film are respectively indicated by dashed lines.

As shown in FIGS. 6 and 7, the guardring 52 is provided in the semiconductor substrate so as to form a closed loop. The impurity diffusion layers 20 of the protection elements 16 are surrounded by the guardring 52 as seen on the plane.

In the present embodiment, an electrostatic discharge inputted to the output terminal $T_{OUT}$ is supplied to channels and the semiconductor substrate 12 provided near the channels through the output line 28, the second main electrode 40 and the impurity diffusion layers 20 each serving as a drain. Since a drain withstand voltage $BV_{sd}$ of each protection element 16 is reduced by introducing the electrostatic discharge into the semiconductor substrate 12, the protection elements 16 are brought into an on state. Thus, the electrostatic discharge flows into the ground line terminal $T_{SS}$ through the impurity diffusion layer 20 serving as the drain of each protection element 16, the impurity diffusion layer 20 serving as a source of each protection element 16, the first main electrodes 38, the guardring electrode 54 and the ground line 56. A substrate potential developed due to the flow of the electrostatic discharge into the ground line terminal $T_{SS}$ is constantly maintained at a built-in potential or voltage such as about 0.7 V, which is determined by the guardring 52 corresponding to an $n^+$ layer and the p-type semiconductor substrate 12.

Further, the electrostatic discharge introduced into the channels of the protection elements 16 and the semiconductor substrate 12 provided near the channels flows into the ground line terminal $T_{SS}$ through the guardring 52, the guardring electrode 54 and the ground line 56.

As has been described above in detail, the substrate potential developed by the flow of the electrostatic discharge is maintained at the built-in potential or voltage. Further, the electrostatic discharge introduced into the channels of the protection elements 16 and the semiconductor substrate 12 provided near the channels flows into a ground power source through the guardring 52. Accordingly, a variation in the substrate potential at a region formed outside the guardring 52 can be significantly reduced. Thus, the substrate potential can be kept substantially constant at a voltage supplied to the substrate from the voltage supply circuit.

Thus, if a circuit apt to malfunction due to the variation in the substrate potential is provided on the semiconductor substrate 12 existing within the outer region of the guardring 52 as seen on the plane, then such a malfunction can be prevented from occurring. Particularly if each buffer MOS is provided within the outer region of the guardring 52 in particular, no snapback is developed in each buffer MOS even if the electrostatic discharge is provided from the output terminal $T_{OUT}$. It is therefore possible to prevent electrostatic breakdown of each buffer MOS and improve an electrostatic breakdown property of the semiconductor device against the electrostatic breakdown.

Figure 8:
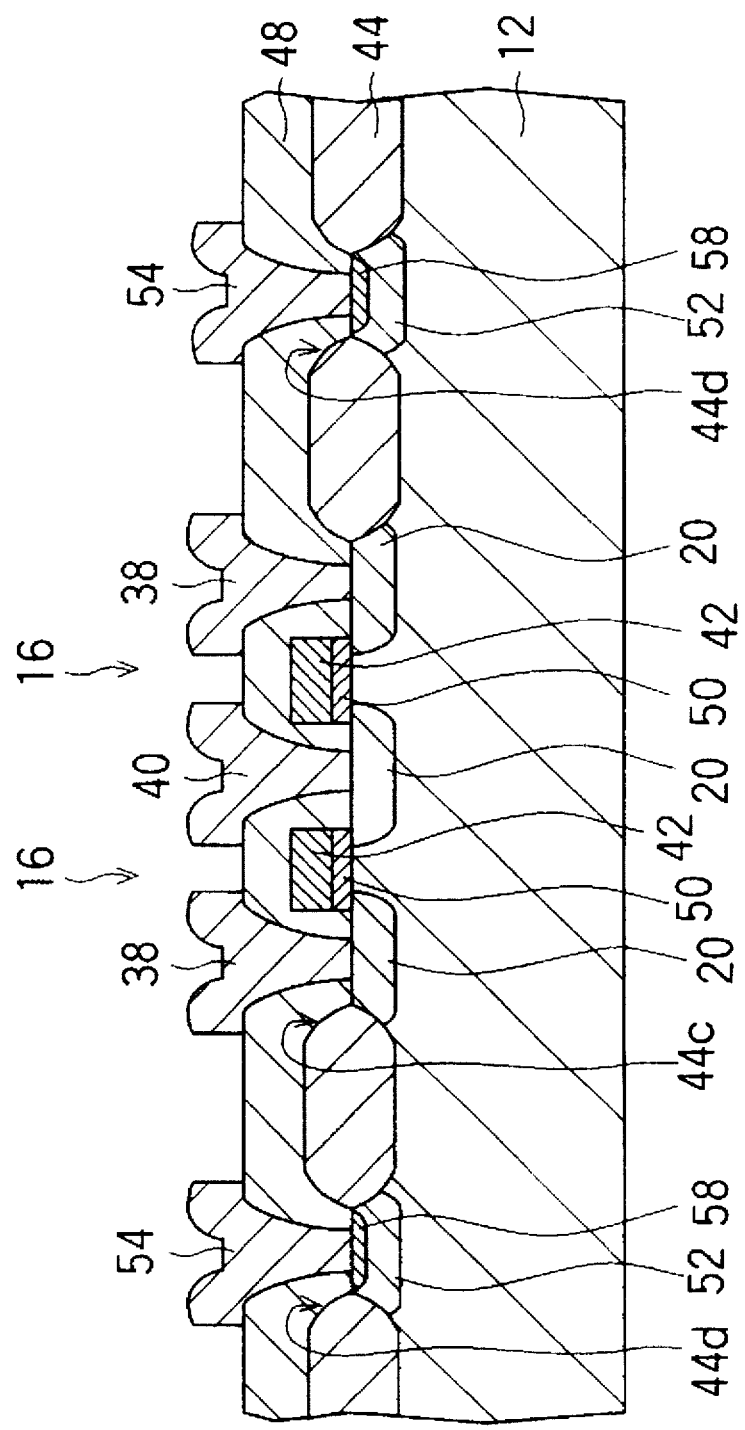
FIG. 8 is a cross-sectional view illustrating a fragmentary configuration of a semiconductor device according to a fourth embodiment of the present invention.

FIG. 8 is a cross-sectional view showing a fragmentary configuration of a semiconductor device according to a fourth embodiment of the present invention. The dissimilarities between the fourth embodiment and the third embodiment will be principally described below. A detailed description of the similarities between the two will be omitted.

In the fourth embodiment, a guardring 52 is composed of a low-density impurity diffusion layer ($n^-$ layer) and an ohmic contact layer 58 is formed in the guardring 52. In the present embodiment, the ohmic contact layer 58 is of an n-type high-density impurity diffusion layer ($n^+$ layer). The guardring 52 is electrically connected to a guardring electrode 54 through the ohmic contact layer 58.

In the present embodiment, a substrate potential can be maintained at a built-in potential or voltage determined by the guardring 52 and a p-type semiconductor substrate 12 even when an electrostatic discharge flows from a turned-on protection element 16 to a ground power source. In the present embodiment, the built-in voltage becomes about 0.5 V because the guardring 52 is of the $n^-$ layer. Thus, the built-in voltage can be reduced by lowering the density of an impurity used for the guardring 52. Accordingly, a variation in the substrate potential can be further reduced as compared with the third embodiment.

As a result, a circuit can be more effectively prevented from malfunctioning due to the variation in the substrate potential. Particularly, the electrostatic breakdown can be more effectively prevented from being developed due to snapback of each buffer MOS, thereby making it possible to further improve an electrostatic breakdown property of the semiconductor device against the electrostatic breakdown.

Figure 9:
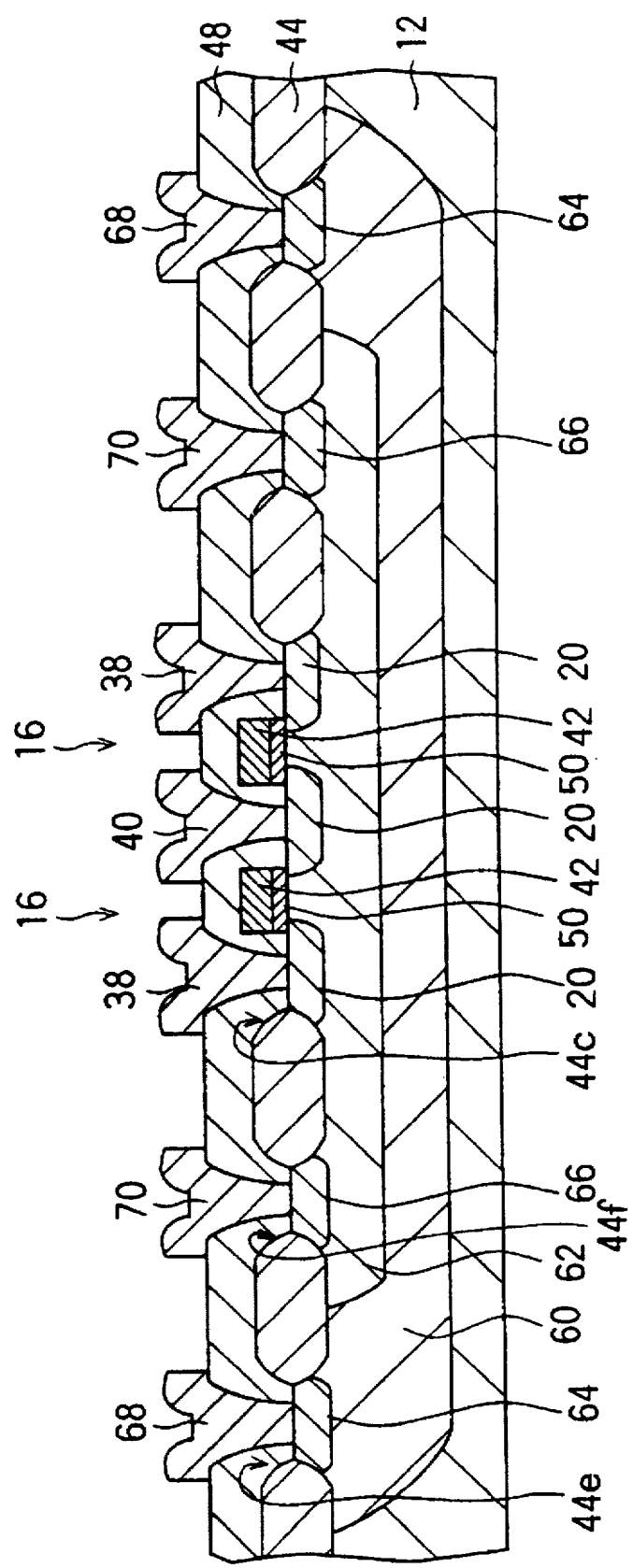
FIG. 9 is a cross-sectional view depicting a fragmentary configuration of a semiconductor device according to a fifth embodiment of the present invention.

FIG. 9 is a cross-sectional view showing a fragmentary configuration of a semiconductor device according to a fifth embodiment of the present invention. The dissimilarities between the fifth embodiment and the first embodiment will be principally described below. A detailed description of the similarities between the two will be omitted.

The semiconductor device according to the fifth embodiment has a second conduction-type first well 60 embedded in a semiconductor substrate 12 and a first conduction-type second well 62 embedded in the first well 60. The first well 60 and the second well 62 are electrically connected to a ground terminal $T_{SS}$. Further, impurity diffusion layers of protection elements 16 are provided within the second well 62.

The present embodiment can be suitably used where, for example, an integrated circuit, an output buffer circuit or a voltage supply circuit is constructed as a twin-well CMOS circuit.

In FIG. 9, the first well 60 is of an n-type well, whereas the second well 62 is of a p-type well. Further, an ohmic contact layer 64 is provided at a peripheral portion of the first well 60. The second well 62 is provided inside a peripheral portion of the first well 60. An ohmic contact layer 66 is provided at the peripheral portion of the second well 62. Further, the impurity diffusion layers 20 of the protection elements 16 are provided inwardly of the peripheral portion of the second well 62.

A window 44e corresponding to a region in which the ohmic contact layer 64 is exposed, is defined in a field oxide film 44. Further, a window 44f corresponding to a region in which the ohmic contact layer 66 is exposed, is defined in the field oxide film 44.

Further, first and second well electrodes 68 and 70 are provided on an interlayer insulating film 48. These electrodes 68 and 70 are respectively electrically connected to the ground terminal $T_{SS}$ through a ground line 24. Thus, the first well 60 and the second well 62 are respectively maintained at a ground potential $V_{SS}$.

Thus, in the sixth embodiment, the impurity diffusion layers 20 of the protection elements 16 are surrounded by a pn-junction formed by the first well 60 and the second well 62. Namely, the bottoms of the impurity diffusion layers 20 of the protection elements 16 as well as side portions thereof are also surrounded by the pn-junction. Further, since the impurity diffusion layers 20 of the protection elements 16 are separated from the semiconductor substrate 12, a variation in substrate potential can be more effectively reduced.

Figure 10:
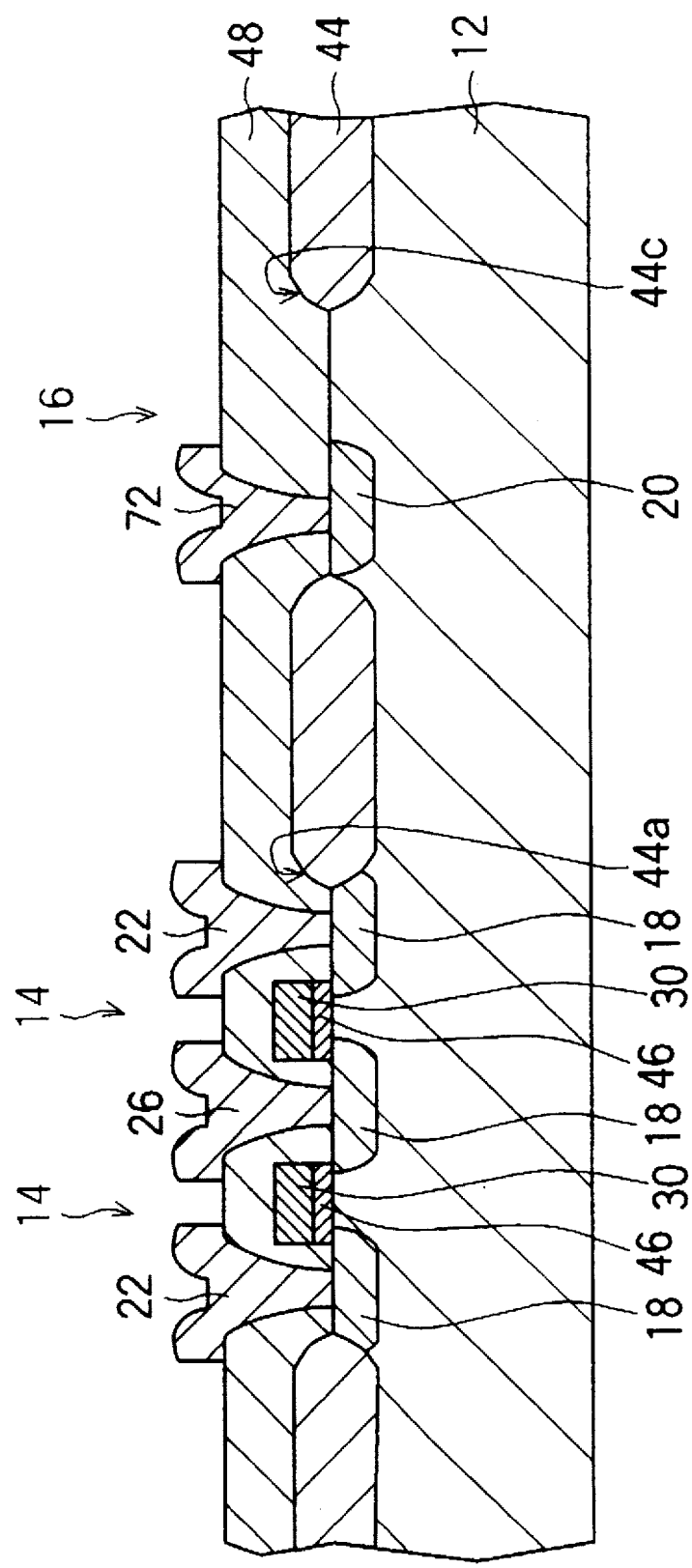
FIG. 10 is a cross-sectional view showing a fragmentary configuration of a semiconductor device according to a sixth embodiment of the present invention.
Figure 11:
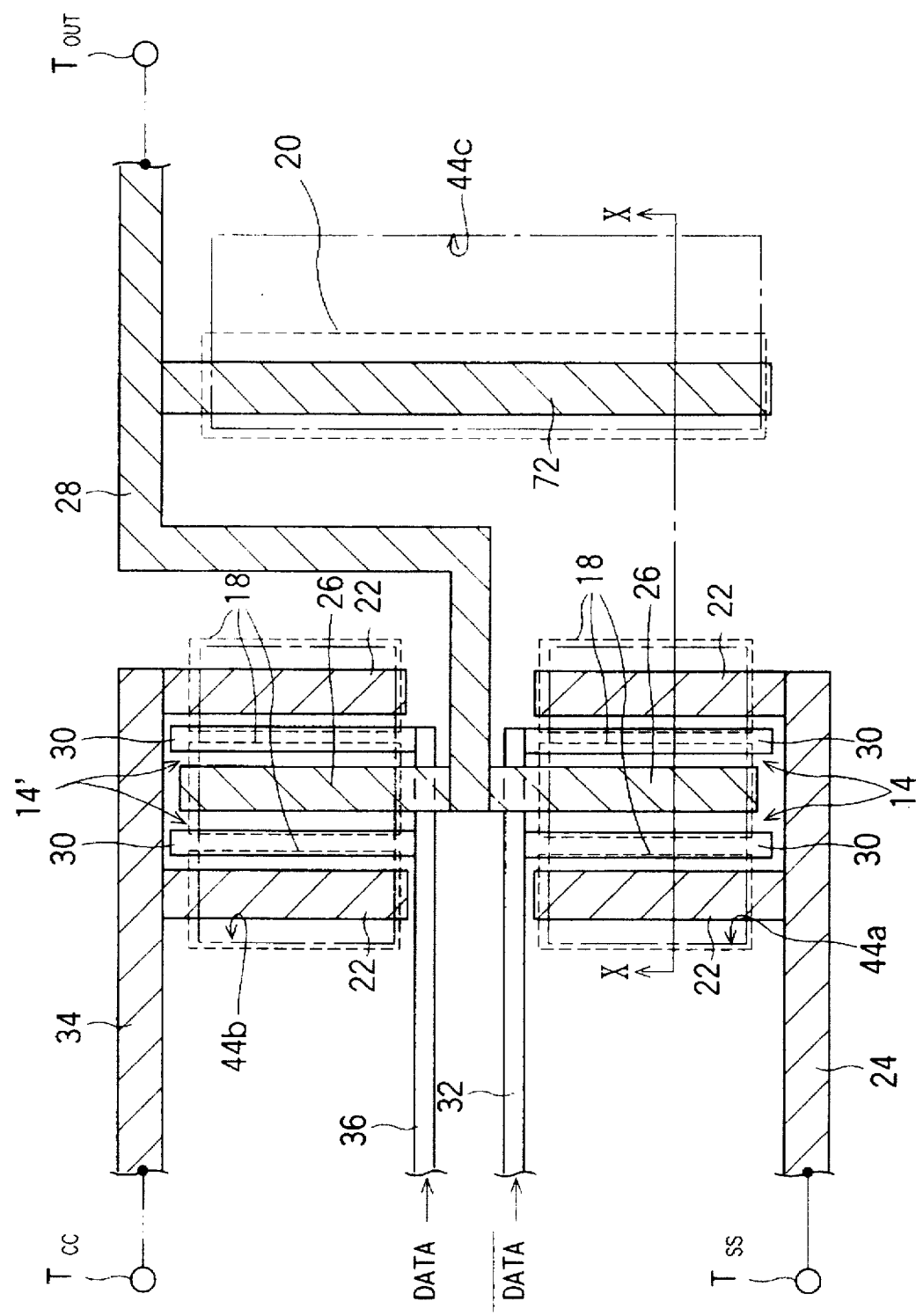
FIG. 11 is a plan view illustrating the fragmentary configuration of the semiconductor device shown in FIG. 10.

FIGS. 10 and 11 are respectively cross-sectional and plan views showing a fragmentary configuration of a semiconductor device according to a sixth embodiment of the present invention. Configurations of buffer MOSs and a protection element 16 and configurations around these are shown in FIG. 11 in a manner similar to FIG. 3. A cross-section taken along line X—X of FIG. 11 corresponds to the cross-sectional view of FIG. 10. The dissimilarities between the sixth embodiment and the first embodiment will be principally described below. A detailed description of the similarities between the two will be omitted.

In the sixth embodiment, the protection element 16 is used as a pn-junction device. In the present embodiment, a zener diode formed by joining an $n^+$ layer and a p layer to each other is used as the protection element 16. Further, an n-type electrode 72 electrically connected to the $n^+$ layer is electrically connected to an output terminal $T_{OUT}$.

The pn-junction for the protection element 16 is composed of an impurity diffusion layer 20 ($n^+$ layer) and a semiconductor substrate 12 (p layer). The impurity diffusion layer 20 is provided within a part of a region corresponding to a window 44c of a field oxide film 44. The impurity diffusion layer is not provided within the remaining region. Further, the n-type electrode 72 is provided on an interlayer insulating film 48. The n-type electrode 72 is electrically connected to the impurity diffusion layer 20 through a contact hole defined in the interlayer insulating film 48. In addition, the n-type electrode 72 is electrically connected to the output terminal $T_{OUT}$ through an output line 28.

In the present embodiment, the protection element 16 causes zener breakdown when an electrostatic discharge is inputted to the output terminal $T_{OUT}$. A breakdown voltage at this time is lower than a drain voltage of each buffer MOS. As a result, the electrostatic discharge flows into the semiconductor substrate 12 through the n-type electrode 72 and the impurity diffusion layer 20. However, impurity diffusion layers 18 of the buffer MOSs are separated from one another by the impurity diffusion layer 20 of the protection element 16 and the field oxide film 44 and are located in positions spaced away from the impurity diffusion layer 20. Accordingly, a voltage drop is developed by the field oxide film 44 and the substrate 12 provided around the field oxide film 44 to provide a less change in substrate potential at a region where each buffer MOS is formed. As a result, electrostatic breakdown can be effectively prevented from being developed due to snapback of each buffer MOS.

The present invention is not necessarily limited to the aforementioned embodiments alone. Structures, shapes, dimensions of respective components, the number of the components, forming materials, conduction types and other conditions can be suitably changed.

In the aforementioned embodiments, the conduction-type of each element can be changed to a reverse conduction-type, for example. However, the connection of the n-type electrode 72 employed in the sixth embodiment to the $n^+$ layer of the protection element 16 preferably not changed.

A MOSFET whose drain withstand voltage $BV_{sd}$ is lower than that of a buffer MOS, such as an As arsenic single-drain type MOSFET, a MOSFET having a DDD (double diffused drain) structure can be used as the protection element 16 in addition to the MOSFET having the offset gate structure.

Further, the integrated circuit can be set as a digital circuit, an operational amplifier using MOSFETs or other analog circuit as well as a memory circuit constructed using MOSFETs.

According to the present invention, as has been described above in detail, even when the electrostatic discharge is introduced into the substrate, the protection element can prevent an increase in the substrate potential at the region where each buffer MOS is formed. Thus, since the snapback of each buffer MOS can be restrained from generation, the electrostatic breakdown of each buffer MOS can be prevented from occurring.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor device comprising:
    an integrated circuit formed on a first conduction-type semiconductor substrate, the semiconductor substrate having a voltage supplied thereto;
    an output buffer circuit for outputting a signal obtained from said integrated circuit;
    a protection circuit for protecting said output buffer circuit; and
    said output buffer circuit having buffer MOSFETs;
    said protection circuit having protection MOSFETs, including impurity diffusion layers, for preventing electrostatic breakdown of said buffer MOSFETs; and
    said buffer MOSFETs having impurity diffusion layers separated from said impurity diffusion layers of said protection MOSFETs by an interposed field oxide film.

2. A semiconductor device according to claim 1, wherein said semiconductor device includes an output terminal and a ground terminal, and wherein said buffer MOSFETs and said protection MOSFETs are respectively operatively coupled in parallel between said output terminal of said semiconductor device and said ground terminal thereof.

3. A semiconductor device according to claim 1, wherein said semiconductor device includes an output terminal and a power source terminal, and wherein said buffer MOSFETs and said protection MOSFETs are respectively operatively coupled in parallel between said output terminal of said semiconductor device and said power source terminal thereof.

4. A semiconductor device according to claim 1, wherein each of said buffer MOSFETs has a lightly doped drain (LDD) structure.

5. A semiconductor device according to claim 1, wherein the impurity diffusion layers of said protection MOSFETs are surrounded in a plane by a second conduction-type guard ring.

6. A semiconductor device according to claim 1, wherein said impurity diffusion layers of said protection MOSFETs each have bottom and side portions surrounded by a pn-junction.

* * * * *